(12) United States Patent
Parker

(10) Patent No.: US 7,519,603 B2
(45) Date of Patent: Apr. 14, 2009

(54) EFFICIENT DATA STRUCTURE

(75) Inventor: Eric G. Parker, Wylie, TX (US)

(73) Assignee: Zyvex Labs, LLC, Richardson, TX (US)

(*) Notice: Subject to any disclaimer, the term of this patent is extended or adjusted under 35 U.S.C. 154(b) by 419 days.

(21) Appl. No.: 10/306,464

(22) Filed: Nov. 27, 2002

(65) Prior Publication Data
US 2006/0143202 A1 Jun. 29, 2006

(51) Int. Cl.
*G06F 17/30* (2006.01)
(52) U.S. Cl. .............. 707/100; 715/823; 345/420; 345/421
(58) Field of Classification Search .......... 707/100; 600/159; 345/440, 420–421, 428; 716/6; 365/222; 703/1–2; 700/184; 717/125; 715/823
See application file for complete search history.

(56) References Cited

U.S. PATENT DOCUMENTS

| | | | | |
|---|---|---|---|---|
| 4,202,046 | A * | 5/1980 | Ward | 365/222 |
| 5,177,689 | A * | 1/1993 | Kinasi et al. | 700/184 |
| 5,469,366 | A * | 11/1995 | Yang et al. | 716/6 |
| 5,504,854 | A * | 4/1996 | Yamashita | 715/823 |
| 5,659,493 | A * | 8/1997 | Kiridena et al. | 703/2 |
| 5,742,291 | A * | 4/1998 | Palm | 345/420 |
| 5,758,122 | A * | 5/1998 | Corda et al. | 717/125 |
| 5,923,573 | A * | 7/1999 | Hatanaka | 703/2 |
| 6,038,533 | A * | 3/2000 | Buchsbaum et al. | 704/260 |
| 6,088,035 | A * | 7/2000 | Sudarsky et al. | 345/421 |
| 6,279,007 | B1 | 8/2001 | Uppala | |
| 6,307,558 | B1 * | 10/2001 | Mao | 345/428 |
| 6,539,519 | B1 * | 3/2003 | Meeker | 716/2 |
| 6,597,359 | B1 * | 7/2003 | Lathrop | 345/440 |
| 6,629,065 | B1 * | 9/2003 | Gadh et al. | 703/1 |
| 6,741,973 | B1 * | 5/2004 | Dove et al. | 706/13 |
| 6,765,574 | B1 * | 7/2004 | Mao et al. | 345/428 |
| 6,816,846 | B1 * | 11/2004 | Back et al. | 706/13 |
| 6,865,509 | B1 * | 3/2005 | Hsiung et al. | 702/182 |
| 6,965,816 | B2 * | 11/2005 | Walker | 701/16 |
| 6,986,739 | B2 * | 1/2006 | Warren et al. | 600/159 |

(Continued)

OTHER PUBLICATIONS

E. Parker, et al., "Exploiting Self-Similarity in Geometry for Voxel Based Solid Modeling", Eight ACM Symposium on Solid Modeling and Applications SM'03, Jun. 16-20, 2003, Seattle, Washington.

(Continued)

*Primary Examiner*—Don Wong
*Assistant Examiner*—Sheree N Brown
(74) *Attorney, Agent, or Firm*—Haynes and Boone, LLP

(57) ABSTRACT

In one embodiment, the present invention is directed to a data structure for representing a spatial region. The data structure comprises a hierarchical arrangement of nodes associated with a plurality of refinement levels, wherein each node of the hierarchical arrangement of nodes is a regular spatial subdivision of the spatial region or another node that is associated with a preceding refinement level. The hierarchical arrangement of nodes forms a directed acyclic graph. The hierarchical arrangement of nodes comprises at least two nodes that have respective edges that are traversed to a common child node such that the hierarchical arrangement of nodes does not comprise a repeated pattern from any two nodes of a common refinement level of the data structure.

8 Claims, 4 Drawing Sheets

U.S. PATENT DOCUMENTS

| | | | |
|---|---|---|---|
| 7,002,571 B2* | 2/2006 | Lake et al. | 345/420 |
| 2001/0044327 A1 | 11/2001 | Kanefsky | |
| 2002/0026252 A1* | 2/2002 | Wruck et al. | 700/90 |
| 2002/0027563 A1 | 3/2002 | Van Doan et al. | |
| 2002/0068500 A1* | 6/2002 | Gabai et al. | 446/176 |
| 2002/0138353 A1* | 9/2002 | Schreiber et al. | 705/26 |
| 2003/0093187 A1* | 5/2003 | Walker | 701/1 |
| 2003/0137539 A1* | 7/2003 | Dees | 345/762 |
| 2003/0187867 A1* | 10/2003 | Smartt | 707/102 |
| 2003/0212725 A1* | 11/2003 | Ovshinsky et al. | 708/490 |
| 2003/0227455 A1* | 12/2003 | Lake et al. | 345/421 |
| 2004/0205093 A1 | 10/2004 | Li et al. | |

OTHER PUBLICATIONS

E. Parker, et al., "Memulator: a Fast and Accurate Geometric Modeling, Visualization and Mesh Generation for 3D MEMs Design and Simulation", Nonotech 2003 vol. 2, Technical Proceedings of the 2003 Nanotechnology Conference and Trade Show.

T. Udeshi, "Tetrahedral Mesh Generation from Segmented Voxel Data", 12th International Meshing Roundtable, Sep. 14-17, 2003.

Co et al., "Iso-Splatting: A Point Based Alternative to Isosurface Visualization", Proceedings of the 11th Pacific Conference on Computer Graphics and Applications (PG'03), IEEE 2003.

International Search Report from PCT Application No. PCT/US2004/043833, May 2005.

Rusinkiewicz et al., "Qsplat: A Multiresolution Point Rendering System for Large Meshes", Computer Graphics Proceedings, Annual Conference Series 2000, pp. 343-352.

Written Opinion of the International Searching Authority from PCT Application No. PCT/US2004/043833, May 2005.

Hinze, "Memo Functions, Polytypically!", Institut fur Informatik III, University Bonn, Bonn Germany, Jul. 2000.

Tiankai et al., "The Etree Library: A System for Manipulating Large Octrees on Disk", School of Computer Science, Pittsburgh, PA Jul. 2003.

Popinet, "Gerris: a Tree-Based Adaptive Solver for the Incompressible Euler Equations in Complex Geometries", Journal of Computational Physics Academic Press USA, vol. 190, No. 2, Sep. 2003.

International Search Report from PCT Application No. PCT/US2004//035625, Mar. 2005.

Written Opinion of the International Searching Authority from PCT Application No. PCT/US2004/035625, Mar. 2005.

Chang et al., "LDI: a Hierarchical Representation for Image-Based Rendering", May 1999, ACM Special Interest Group on Computer Graphics and Interactive, pp. 291-298.

Pratt, "Direct Least-Squares Fitting of Algebraic Surfaces", Computer Graphics, vol. 21, No. 4, Jul. 1987.

Wilhelms et al., "Octrees for Faster Isosurface Generation", Jul. 1992, ACM Press, vol. 22, Issue 3, pp. 201.227.

* cited by examiner

OCTREE_ELEMENT_STRUC_1 /501
{ reference to OCTREE_ELEMENT_STRUC_4; /502
  reference to OCTREE_ELEMENT_STRUC_4; /503
  reference to OCTREE_ELEMENT_STRUC_4; /504
  reference to OCTREE_ELEMENT_STRUC_4; /505
  reference to OCTREE_ELEMENT_STRUC_2; ~506
  reference to OCTREE_ELEMENT_STRUC_2; ~507
  reference to OCTREE_ELEMENT_STRUC_3; ~508
  reference to OCTREE_ELEMENT_STRUC_3; ~509
}

OCTREE_ELEMENT_STRUC_2 /550
{ EMPTY; ~551
  non-binary data structure; /552
  EMPTY; ~553
  non-binary data structure; /554
  non-binary data structure; ~555
  EMPTY; ~556
  non-binary data structure; ~557
  EMPTY; ~558
}

OCTREE_ELEMENT_STRUC_3 /570
{ non-binary data structure; ~571
  non-binary data structure; ~572
  non-binary data structure; ~573
  non-binary data structure; ~574
  non-binary data structure; ~575
  non-binary data structure; ~576
  non-binary data structure; ~577
  non-binary data structure; ~578
}

OCTREE_ELEMENT_STRUC_4 ~590
{ EMPTY; ~591
  EMPTY; ~592
  EMPTY; ~593
  EMPTY; ~594
  EMPTY; ~595
  EMPTY; ~596
  EMPTY; ~598
  EMPTY; ~599
}

*FIG. 5*

```
           452x562x92
ARRAY              68,555,504
ADAPTIVE OCTREE    32,121,700
DAG                 2,613,536
SAVINGS:               96.18%
```

```
          3672x1594x92
ARRAY           1,615,474,368
ADAPTIVE OCTREE   812,738,552
DAG                 2,963,736
SAVINGS:               99.81%
```

15640x11046x96
ARRAY            49,754,718,720
ADAPTIVE OCTREE  11,900,655,552
DAG                  24,640,088
SAVINGS:                 99.95%

EFFICIENT DATA STRUCTURE

TECHNICAL FIELD

The present invention is generally related to data structures for the representation of spatial regions and, more particularly, to systems and methods for efficiently storing data sets that represent engineered structures.

BACKGROUND OF THE INVENTION

In computer science, there are a number of data structures that have been developed to represent spatial data. For example, the quadtree data structure has been utilized to represent graphical data structures. A quadtree tree is a two dimensional data structure that represents objects hierarchically. Each child node of a quadtree represents a quadrant of a parent node.

FIG. 1 graphically depicts exemplary quadtree 100 that includes nodes 101, 102, 103, and 104 which are the first quadrants (spatial subdivisions) of the data structure. Node 103 is empty and, hence, does not contain any further child nodes. Accordingly, it is unnecessary to represent further spatial subdivisions of node 103. A special code, character, or pointer-value may be used to implement node 103 to indicate that node 103 is an empty node. Nodes 101, 102, and 104 are further subdivided. Specifically, the upper left and lower right quadrants of each of nodes 101, 102, and 104 are occupied. Each of the parent nodes (nodes 101, 102, and 104) may be implemented as a set of pointers (or other suitable characters or codes) to data structures that represent the respective child nodes. The empty child nodes of nodes 101, 102, and 104 may be represented by the same special code, character, or pointer-value that is used to implement node 103. The non-empty child nodes (nodes 105-110) of the parent nodes (nodes 101, 102, and 104) may be represented in several ways. The non-empty child nodes may be represented as a pointer to a data structure that represents the contents of the child nodes. Alternatively, the non-empty child nodes may be represented by a suitable character or code that represents the contents of the child node. The implementation of the non-empty leaf nodes may depend upon the complexity of the contents of the leaf nodes. If the contents of the leaf nodes are limited (e.g., restricted to a small range of colors if the quadtree represents a graphical image), it may be more memory efficient to utilize a character or code as opposed to a pointer to another data structure.

An octree is a generalization of the tree structure to three-dimensional space. Each node ("cube") may be subdivided into eight further nodes. FIG. 2 graphically depicts node 200 of the octree (which represents the entire spatial region associated with the octree), the first subdivided level 201 of the octree (which contains 8 nodes), and the second subdivided level 202 of the octree (which contains 64 nodes). In the same manner as a quadtree tree, leaf nodes may be identified at multiple levels of the same octree and a parent node may be implemented as a set of pointers to the respective child nodes of the parent node.

Furthermore, a graph is another data structure that is well-known in computer science. A graph is a set of nodes and a set of edges where an edge is defined by the a pair of nodes it connects. A directed graph is a graph where the order of the nodes in an edge is relevant (e.g., the graph is traversed in a particular direction by an associated algorithm). Acyclic means there are no cycles in the graph, i.e., no path through the graph can traverse the same node more than once. FIG. 3 depicts an example of a directed acyclic graph (DAG) 300 according to the prior art. DAG 300 begins at node A and continues to node B and then to node C. At node C, two edges may be traversed. At node C, an edge may be traversed by continuing to node E where the graph terminates. Also, at node C, another edge may be traversed by continuing to node D. From node D, DAG 300 continues to node E where the graph terminates.

In one unusual known application, the binary quadtree data structure and the directed acyclic graph data structure were combined. Specifically, the adaptation of the "life algorithm" developed by Bill Gosper utilized this combination to represent the evolution of "life" in a finite two-dimensional space. The life algorithm begins by defining the presence or absence of life in each spatial subdivision of the finite two-dimensional space where a logical zero represents the absence of life and a logical one represents the presence of life. The life algorithm operates by determining whether existing life will continue or cease and whether life in each empty subdivision will develop. The algorithm makes these determinations upon the basis of density of life in adjacent spatial subdivisions. In essence, overcrowding leads to cessation of life while a certain amount of density is required for development. The life algorithm operates by iterating the determination of whether life will continue and whether life will develop. The advantage of the combination of the binary quadtree data structure and the DAG data structure is that similar patterns of "life" that arise in subsequent iterations do not require recalculation. Accordingly, the combination data structure simplifies the processing of the life algorithm.

BRIEF SUMMARY OF THE INVENTION

The present invention is directed to a system and method which efficiently represent engineered or highly redundant data sets. Embodiments of the present invention are directed to a data structure for representing a complete region of space. The data structure may be related as a hierarchical arrangement of nodes associated with a plurality of refinement levels. Each node of the hierarchical arrangement of nodes may advantageously be a regular spatial subdivision of either the complete region of space or another node that is associated with a preceding refinement level. The hierarchical arrangement of nodes holds references or pointers at various nodes such that the hierarchical arrangement forms a directed acyclic graph. Also, the hierarchical arrangement of nodes does not comprise a repeated pattern of spatial subdivisions from any two nodes of a common refinement level. In embodiments of the present invention, the hierarchical arrangement does not comprise a repeated pattern of spatial subdivisions from any two nodes of the data structure. Additionally, the leaf nodes are advantageously associated with either a default value or a non-binary data structure that represents the contents of the respective leaf node.

In embodiments of the present invention, such a data structure may be utilized to represent engineered devices. For example, embodiments of the present invention may provide a computer aided design (CAD) system to permit the design of Micro-Electro-Mechanical (MEMs) devices. MEMs devices may comprise a relatively large degree of redundancy due to the partial symmetry of discrete elements within the MEMs devices and the partial symmetry of MEMs devices themselves. Thus, embodiments of the present invention may store data representations of engineered devices with a substantial degree of efficiency by utilizing an advantageously designed data structure.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 5 depicts a pseudo-code representation of a DAG octree data structure according to embodiments of the present invention;

DETAILED DESCRIPTION OF THE INVENTION

Figure 1:
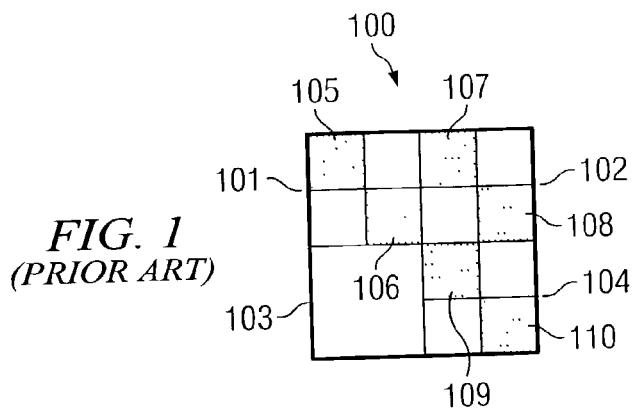
FIG. 1 depicts a quadtree according to the prior art.
Figure 2:
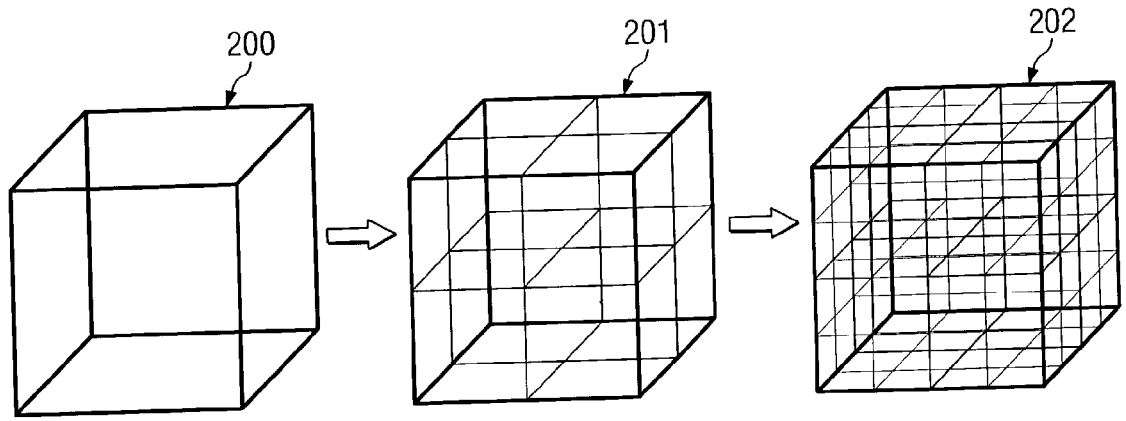
FIG. 2 depicts various levels of an octree according to the prior art.
Figure 3:
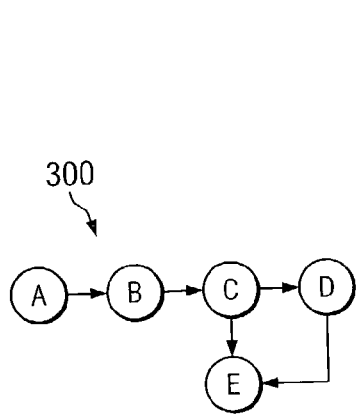
FIG. 3 depicts a directed acyclic graph according to the prior art.
Figure 4:
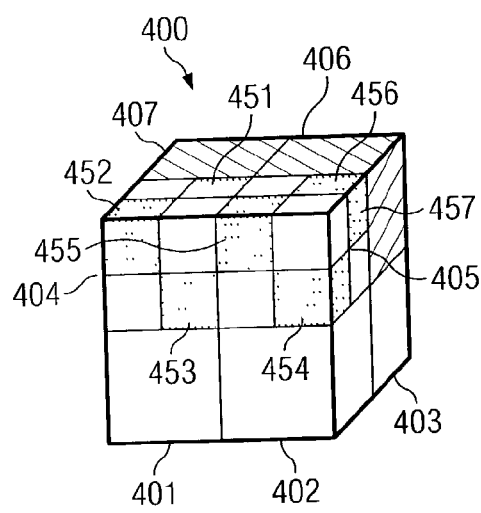
FIG. 4 depicts an exemplary object to be modeled by a data structure according to embodiments of the present invention.

For the sake of illustration, reference is now made to FIG. 4 which depicts object 400. Object 400 is divided into octree elements or cubes. Object 400 may represent a manufactured object with each octree element representing the respective material used for the respective octree element or cube. The entire bottom portion of object 400 is shown as being empty. Specifically, element 401 (bottom front left), element 402 (bottom front right), and element 403 (bottom rear right element) are shown as being empty. The bottom rear left element is not shown in FIG. 4 due to the perspective of the drawing. Element 406 (top rear right) and element 407 (top rear left) are shown as being uniformly composed of the same material. Element 404 (top front left) and element 405 (top front right) are identical and possess "checkerboard" designs. Specifically, the top front left, the top rear right, the bottom rear left, and the bottom front right sub-elements of elements 404 and 405 are uniformly composed of a selected material. As shown, elements 451, 452, and 453 of element 404 are composed of the selected material (the other element is not shown due to the perspective of the drawing). Also, as shown, elements 454, 455, and 456 of element 405 are composed of the selected material (the other element is not shown due to the perspective of the drawing).

FIG. 5 depicts a pseudo-code representation of DAG octree 500 that represents object 400 according to embodiments of the present invention. OCTREE_ELEMENT_STRUCT_1 depicts the first regular spatial subdivision of the entire space occupied by object 400, i.e., data elements 502 through 509 represent the eight octree elements or cubes at the first hierarchical level. Data elements 502, 503, and 504 respectively represent elements 401, 402, and 403 of object 400. Data element 505 represents the bottom rear left corner of object 400 which is not shown in FIG. 4. All of these spatial subdivisions are identical. Accordingly, the spatial subdivisions are implemented using respective references or pointers to the same data structure (OCTREE_ELEMENT_STRUCT_4 590). Similarly, data elements 506 and 507 respectively represent elements 404 and 405 of object 400. Because elements 404 and 405 are identical, DAG octree 500 does not separately represent each of these elements as separate data structures. Instead, data elements 506 and 507 may be advantageously implemented as references or pointers to refer to the same data structure (OCTREE_ELEMENT_STRUCT_2 550) that describes the same pattern. Data elements 508 and 509 represent the spatial subdivisions associated with elements 406 and 407. Since elements 406 and 407 are identical, data elements 508 and 509 may be implemented as references to the same data structure (OCTREE_ELEMENT_STRUCT_3 570) that describes the same pattern.

OCTREE_ELEMENT_STRUCT_2 550 represents another octree regular spatial subdivision. In this case, OCTREE_ELEMENT_STRUCT_2 550 represents a "checkerboard" pattern. Data elements 551, 553, 556, and 558 may comprise a code or character that indicates that these elements are empty or associated with a default value. Data elements 552, 554, 555, and 557 may comprise a non-binary data structure that represents the material composition of the associated elements (e.g., elements 451, 452, 453, and the bottom rear left element which is not shown) of object 400. Alternatively, each of data elements 552, 554, 555, and 557 may comprise a pointer to a non-binary data structure that represents the material composition of the corresponding elements of object 400. Likewise, OCTREE_ELEMENT_STRUCT_3 570 represents another octree regular spatial subdivision. In this case, OCTREE_ELEMENT_STRUCT_3 570 represents the uniform composition of elements 406 and 407 by comprising eight respective non-binary data structures 571-578 (or pointers thereto) that describes the particular composition associated with elements 406 and 407. OCTREE_ELEMENT_STRUCT_4 590 represents another octree regular spatial subdivision. In this case, OCTREE_ELEMENT_STRUCT_4 590 represents the uniformly empty composition by comprising eight respective empty data structures 591-598.

DAG octree 500 provides several advantages. First, DAG octree 500 efficiently represents the redundancy of data associated with object 400. For example, elements 404 and 405 of object 400 are identical. Accordingly, the paths associated with these elements are traversed by arriving at the same node via the pointers to OCTREE_ELEMENT_STRUCT_2. Thus, the total amount of memory that is required to represent object 400 is reduced. It shall be appreciated that only a single copy of OCTREE_ELEMENT_STRUCT_2 is required regardless of how many times that the spatial pattern it represents occurs within the overall data structure. Additionally, it shall be appreciated that the compressed data representation of object 400 is lossless, i.e., object 400 may be fully reconstructed from the data structure of DAG octree 500 without loss of detail or resolution.

The pseudo-code representation of DAG octree 500 is merely exemplary. Embodiments of the present invention may utilize any data structure representation or any suitable syntax or language to define a DAG tree structure that avoids or reduces repetition of patterns within the data structure. Also, it shall be appreciated that the present invention is not limited to octree structures. Embodiments of the present invention may operate with any arbitrary K-dimensional tree. Furthermore, embodiments of the present invention are not limited to the number of hierarchical levels shown in FIGS. 4 and 5. Embodiments of the present invention may utilize any number of hierarchical levels subject to storage capacity used for a particular implementation.

It is appropriate to compare DAG octree structures according to embodiments of the present invention with concepts associated with known graphical data structures. Specifically, a certain amount of loss (e.g., by quantization) is thought to be typically required to store data that is used to create graphical images in an efficient manner. This assumption may be correct for various classes of data (e.g., digital photographs) related to graphical images. However, this assumption is not correct for specific classes of data. In particular, engineered objects may comprise a large degree of regularity or redundancy. Thus, engineered objects may be very efficiently represented by a DAG octree data structure according to embodiments of the present invention.

Figure 6A:
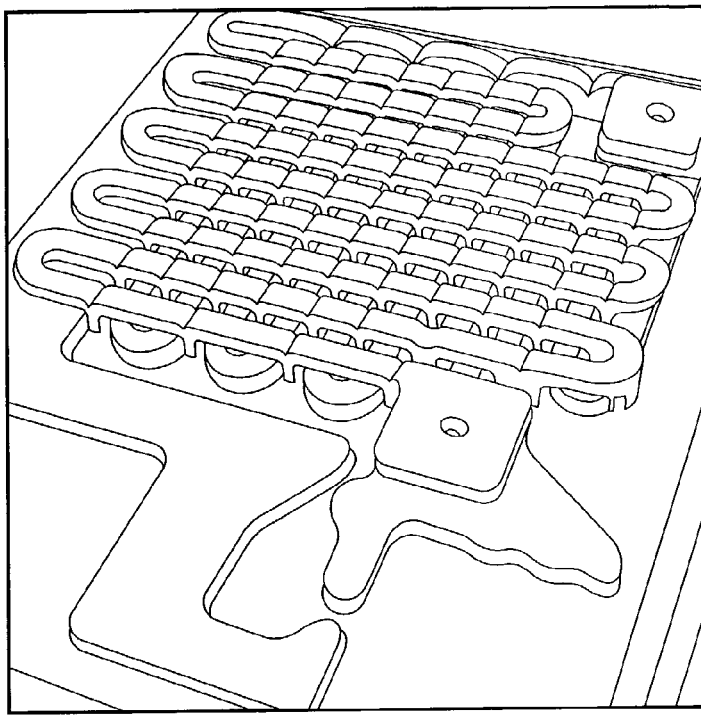
FIGS. 6A-6C depict various MEMs devices that are modeled using DAG octree data structures according to embodiments of the present invention.
Figure 6B:
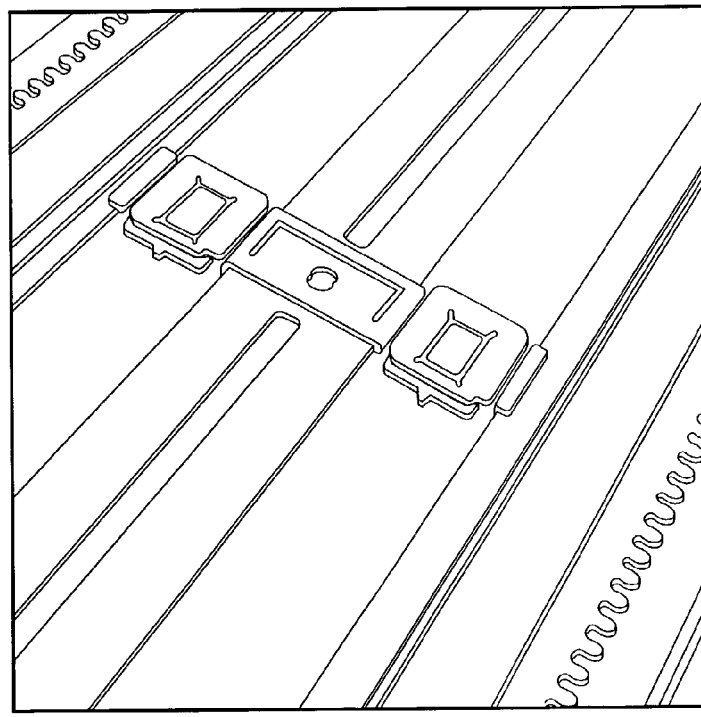
Figure 6C:
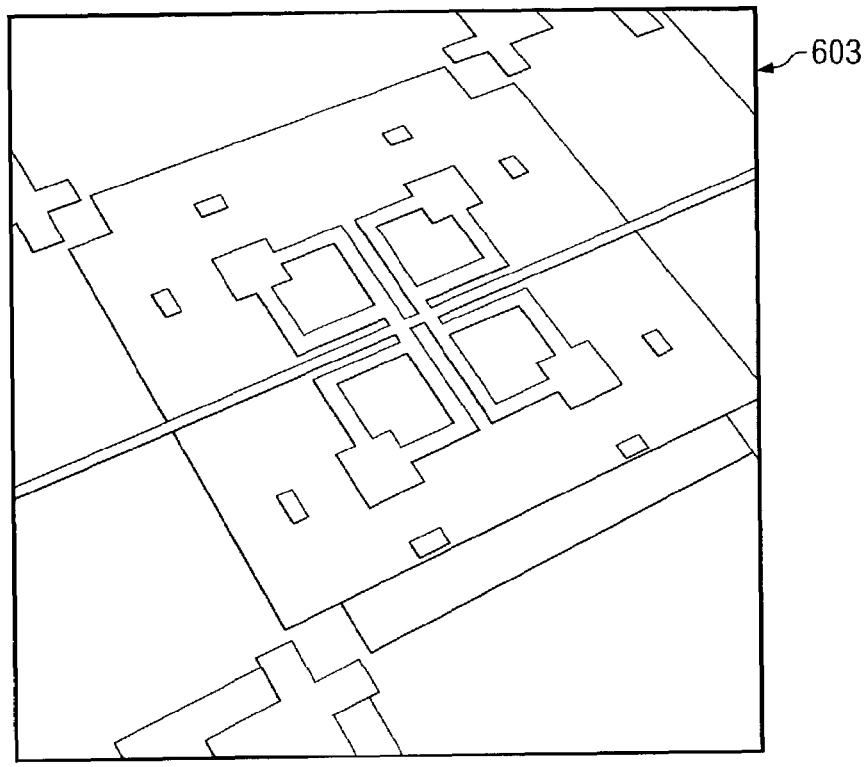

FIGS. 6A-6C represent engineered objects 601-603 which, for the sake of illustration, are MEMs devices. As shown, engineered object 601 is implemented in a space that occupies 452×562×92 spatial elements, engineered objected 602 is implemented in a space that occupies 3672×1594×92 spatial elements, and engineered object 603 is implemented in a space that occupies 15640×11046×96 spatial elements. Moreover, the representation of engineered objects 601-603 in the form of three dimensional arrays respectively required 68,555,504, 1,615,474,369 and 49,754,718,720 bytes of data. The representation of engineered objects 601-603 in the form of adaptive octrees respectively required 32,121,700, 812,738,552 and 11,900,655,552 bytes of data. According to embodiments of the present invention, the representation of engineered objects 601-603 in the form DAG octrees respectively required 2,613,536, 2,963,736 and 24,640,088 bytes of data. Thus, the representation of engineered objects 601-603 according to embodiments of the present invention entails a memory savings of 96.18% for object 601, 99.81% for object 602, and 99.95% for object 603 as compared to representation utilizing three dimensional arrays.

Figure 7:
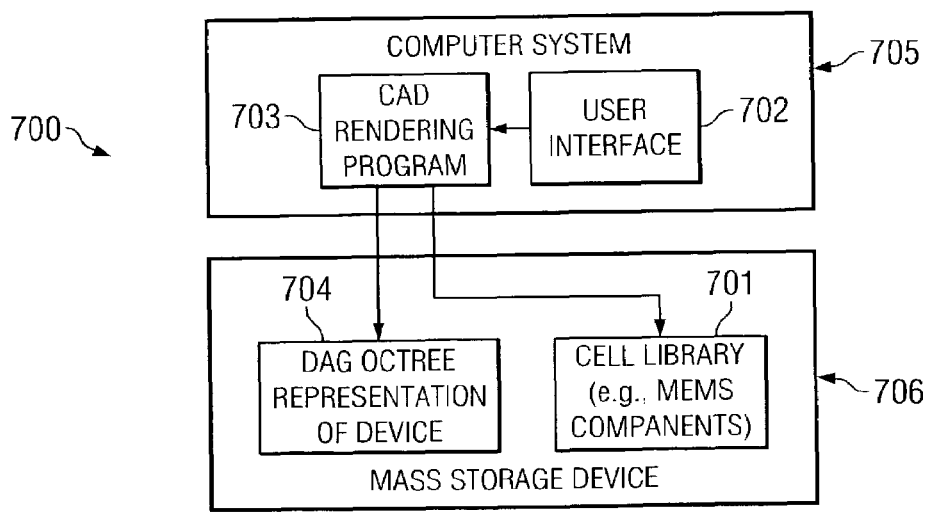
FIG. 7 depicts a CAD system that utilizes a DAG octree data structure according to embodiments of the present invention.

FIG. 7 depicts computer aided design (CAD) system 700 according to embodiments of the present invention. CAD system 700 may be designed to create engineered objects (e.g., MEMs devices) from, in part, standard cell components. The standard cell components may be stored in library 701 stored utilizing mass storage device 706. For the example of MEMs device design, the cell components may include discrete MEMs elements such as thermal actuators, electrostatic actuators, micro-grippers, micro-latches, micro-tethers, micro-rotators, and/or the like. The standard cell components may define the respective spatial composition of the various discrete elements.

User interface 702 and CAD rendering program 703 may be implemented as software processes executing on computer system 705. A user may "pick-and-place" discrete cell components utilizing user interface 702 and, in response, CAD rendering program 703 may select the respective cell component from cell library 701. When the user "drops" the discrete cell component at a desired location, CAD rendering program 703 may locate the respective portions of DAG octree representation 704 of the device being designed. CAD rendering algorithm 703 may update the portions of DAG octree representation 704 to reflect the addition of the cell component. Specifically, the respective leaf nodes of DAG octree 704 may be created and/or modified to reflect the material composition(s) of the cell component at the respective locations. For MEMs devices, a non-binary data structure may be utilized to identify the possible material compositions such as semiconductor materials, oxides, ceramics, metals, and/or the like.

Moreover, after the addition of a discrete component, CAD rendering algorithm 703 may examine DAG octree 704 to ensure that the addition of the data associated with the added element does not cause any repeated patterns within the nodes of DAG octree representation 704. If a repeated pattern is discovered, CAD rendering program 703 may modify DAG octree representation 704 to comprise a reference or pointer to another suitable node of DAG octree representation 704 to eliminate the repeated pattern. Accordingly, CAD system 700 may store representations of engineered devices in an efficient manner thereby reducing the memory requirements necessary to operate CAD system 700.

Although embodiments of the present invention have been described in terms of operating with CAD systems, the present invention is not so limited. Embodiments of the present invention may operate with any data set that comprises sufficient redundancy to benefit from the described DAG K-dimensional tree data structure. For example, embodiments of the present invention may be utilized in medical imaging technology to represent biological structures in an efficient manner.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A computer aided design (CAD) system, comprising:
  interface means configured to receive input defining at least a portion of an engineered structure;
  processing means configured to modify data that represents at least a portion of the defined engineered structure, including the engineered structure's material composition, wherein:
    the data structurally comprises a plurality of nodes hierarchically arranged in a shared, regularly-subdivided tree arrangement including a plurality of leaf nodes;
    each of the plurality of nodes is associated with a spatial subdivision of another node associated with a higher hierarchical level; and each of the plurality of leaf nodes is associated with one of a plurality of cube data structures each comprising a digital representation of a cubical spatial subdivision of the engineered structure and representing the material composition of the spatial subdivision of the engineered structure corresponding to the leaf node;

a library of component cells that are selectable via the interface means; and means for storing the data and the library;

wherein the material composition is selected from a list consisting of: a semiconductor material, a ceramic, an oxide material, and a metal.

2. A computer aided design (CAD) system, comprising:

interface means configured to receive input defining at least a portion of an engineered structure;

processing means configured to modify data that represents at least a portion of the defined engineered structure, including the engineered structure's material composition, wherein:

the data structurally comprises a plurality of nodes hierarchically arranged in a shared, regularly-subdivided tree arrangement including a plurality of leaf nodes;

each of the plurality of nodes is associated with a spatial subdivision of another node associated with a higher hierarchical level; and each of the plurality of leaf nodes is associated with one of a plurality of cube data structures each comprising a digital representation of a cubical spatial subdivision of the engineered structure and representing the material composition of the spatial subdivision of the engineered structure corresponding to the leaf node;

a library of component cells that are selectable via the interface means; and means for storing the data and the library;

wherein the engineering structure comprises a Micro-Electro-Mechanical device.

3. A computer aided design (CAD) system, comprising:

interface means configured to receive input defining at least a portion of an engineered structure;

processing means configured to modify data that represents at least a portion of the defined engineered structure, including the engineered structure's material composition, wherein:

the data structurally comprises a plurality of nodes hierarchically arranged in a shared, regularly-subdivided tree arrangement including a plurality of leaf nodes;

each of the plurality of nodes is associated with a spatial subdivision of another node associated with a higher hierarchical level; and each of the plurality of leaf nodes is associated with one of a plurality of cube data structures each comprising a digital representation of a cubical spatial subdivision of the engineered structure and representing the material composition of the spatial subdivision of the engineered structure corresponding to the leaf node;

a library of component cells that are selectable via the interface means; and means for storing the data and the library;

wherein the processing means is operable to modify the data according to a component cell of the library that is selected via the interface means.

4. The CAD system of claim 3 wherein the processing means is operable to replace a repeated pattern with a reference to another node.

5. The CAD system of claim 3 wherein the plurality of nodes does not comprise a repeated pattern from any two nodes.

6. The CAD system of claim 3 wherein the engineered structure is a three-dimensional structure and the tree arrangement is an octree arrangement.

7. A data structure for representing a spatial region, comprising:

a plurality of cube data structures, each cube data structure comprising a cubical digital representation of non-binary data defining a material composition pattern, wherein no two cube data structures represent identical material composition patterns; and a plurality of nodes hierarchically arranged in a shared, regularly-subdivided tree arrangement, wherein:

each node corresponds to a regular spatial subdivision of the spatial region;

the hierarchical arrangement of nodes forms a directed acyclic graph;

the hierarchical arrangement of nodes comprises leaf nodes that are each associated with one of the plurality of cube data structures;

each of the plurality of cube data structures represents the material composition of the spatial region subdivision associated with the leaf node;

each of the plurality of cube data structures associated with each leaf node includes at least one of a first data value, a second data value, and a third data value;

the first, second, and third data values are each unique relative to each other;

the first, second, and third data values each represent a corresponding one of three different material compositions;

a first one of the leaf nodes is associated with the first data value;

a second one of the leaf nodes is associated with the second data value;

a third one of the leaf nodes is associated with the third data value; and each of the plurality of cube data structures is stored in a means for storing data.

8. The data structure of claim 7 wherein each of the three different material compositions is selected from the group consisting of: a semiconductor material, a ceramic, an oxide material, and a metal.

* * * * *